(12) United States Patent
Moldovan et al.

(10) Patent No.: US 7,237,215 B2
(45) Date of Patent: Jun. 26, 2007

(54) METHOD FOR PROVIDING MEMORY CELLS CAPABLE OF ALLOWING MULTIPLE VARIATIONS OF METAL LEVEL ASSIGNMENTS FOR BITLINES AND WORDLINES

(75) Inventors: Adam G. Moldovan, Essex Junction, VT (US); Jeffery H. Oppold, Richmond, VT (US); Neelesh Govindaraya Pai, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 10/904,226

(22) Filed: Oct. 29, 2004

(65) Prior Publication Data

US 2006/0101366 A1    May 11, 2006

(51) Int. Cl.
*G06F 17/50* (2006.01)

(52) U.S. Cl. .............................. 716/10; 716/11; 716/12

(58) Field of Classification Search ............ 716/10–12; 365/49, 201
See application file for complete search history.

(56) References Cited

U.S. PATENT DOCUMENTS 6,950,355 B2 *    9/2005    Battacharya et al. ........ 365/201

\* cited by examiner

*Primary Examiner*—Vuthe Siek
(74) *Attorney, Agent, or Firm*—Michael J. LeStrange; Dillon & Yudell LLP

(57) ABSTRACT

A method for providing memory cells that allow multiple variations of metal level assignments for bitlines and wordlines is disclosed. A memory cell includes two cell elements. The first and second cell elements are identically processed up to a metal-1 layer. The first cell element is subsequently processed with bitlines on a metal-2 layer and wordlines on a metal-3 layer. Next, the second cell element is processed with bitlines on the metal-3 layer and wordlines on the metal-2 layer.

12 Claims, 5 Drawing Sheets

FEOL

Stage 21: M1 added

Personalization Starts

METHOD FOR PROVIDING MEMORY CELLS CAPABLE OF ALLOWING MULTIPLE VARIATIONS OF METAL LEVEL ASSIGNMENTS FOR BITLINES AND WORDLINES

TECHNICAL FIELD

The present invention relates to software tools in general, and, in particular, to a method within a software tool for designing integrated circuits. Still more particularly, the present invention relates to a method for providing static random memory cells that allow multiple variations of metal level assignments for bitlines and wordlines.

DESCRIPTION OF RELATED ART

Static random access memory (SRAM) cells having different bitline and wordline personalizations are in existence today. For example, some SRAM cells have bitlines built on a metal-3 (M3) layer and wordlines built on a metal-2 (M2) layer, and some SRAM cells have bitlines built on a M2 layer and wordlines built on a M3 layer. Thus, a wafer foundry has to be able to manufacture different SRAM cell architectures in order to cater to different customers that utilize various metal line personalizations.

However, the development of different bitline and wordline personalizations can incur huge expenses. In addition, with various new effects, such as shallow trench isolation (STI) compression, and n-well scattering becoming major modeling issues for devices that operate in the submicron regime, the development of custom SRAM cell device models as well as the associated model-to-hardware can be a burden on various resources such as technology development, yield learning and modeling resources.

Consequently, it would be desirable to provide an improved method for providing SRAM cells that allow multiple variations of metal level assignments for bitlines and wordlines such that some of the above-mentioned expenses can be consolidated.

SUMMARY OF THE INVENTION

In accordance with a preferred embodiment of the present invention, a memory cell includes two cell elements. The first and second cell elements are identically processed up to a metal-1 layer. The first cell element is subsequently processed with bitlines on a metal-2 layer and wordlines on a metal-3 layer. Next, the second cell element is processed with bitlines on the metal-3 layer and wordlines on the metal-2 layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The area and aspect ratio of static random access memory (SRAM) cells are typically common among foundry customers. Thus, they can usually be shared by different foundry customers. However, sometimes different foundry customers would prefer to develop different SRAM cells for different SRAM cell architectures. For example, some foundry customers build their SRAM cells with bitlines on a metal-2 layer and wordlines on a metal-3 layer, and other foundry customers build their SRAM cells with bitlines on a metal-3 layer and wordlines on a metal-2 layer.

In order to accommodate the various needs of different foundry customers for SRAM cells to have bitlines and wordlines on different metal levels, the present invention provides a common SRAM cell with a shared front-end (which includes diffusions, polysilicons, n-wells, p-wells, contacts, and a metal-1 layer) but with several personalized back-ends (which includes metal-2, metal-3 and metal-4 layers). Specifically, the common SRAM cell of the present invention includes two cell elements. Both cell elements are identically processed up to the metal-1 layer. Then, each of the two cell elements is processed differently for the metal-2 layer and above.

Figure 1:
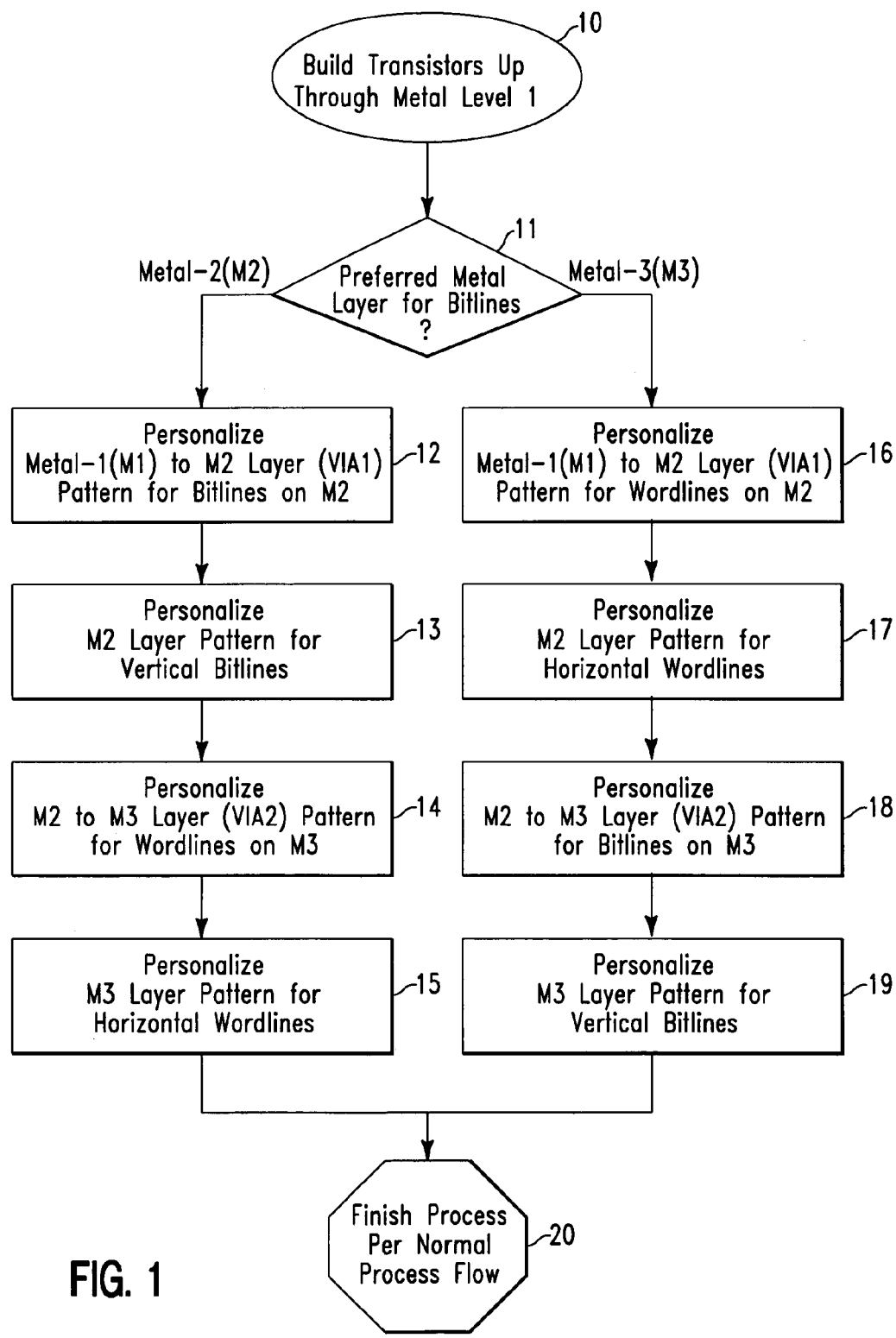
FIG. 1 is a method for providing static random access memory (SRAM) cells that allow multiple variations of metal level assignments for bitlines and wordlines, in accordance with a preferred embodiment of the present invention.
Figure 2A:
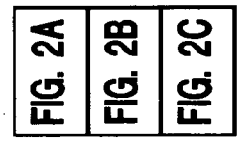
FIG. 2 graphically depicts an SRAM cell having identical front-ends but different back-ends, in accordance with a preferred embodiment of the present invention.
Figure 2A:
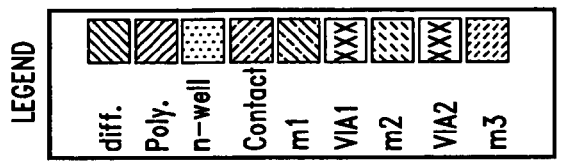
Figure 2A:
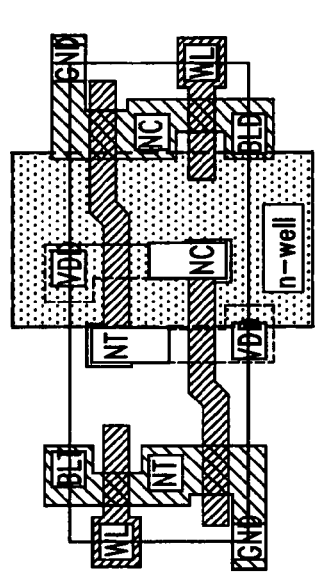
Figure 2A:
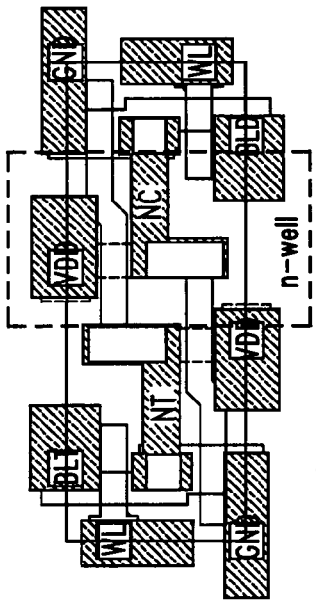
Figure 2A:
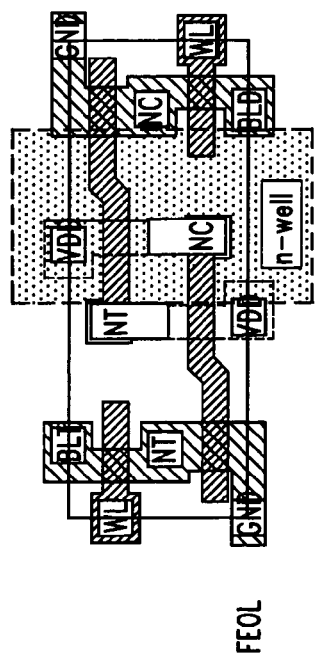
Figure 2A:
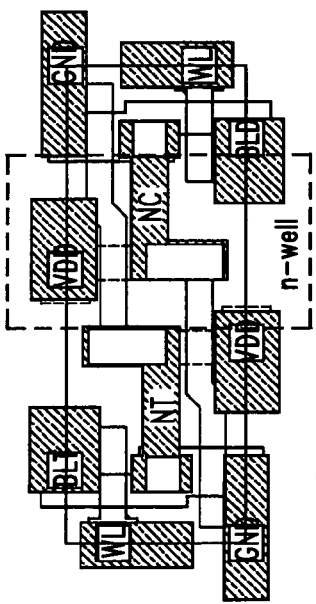
Figure 2B:
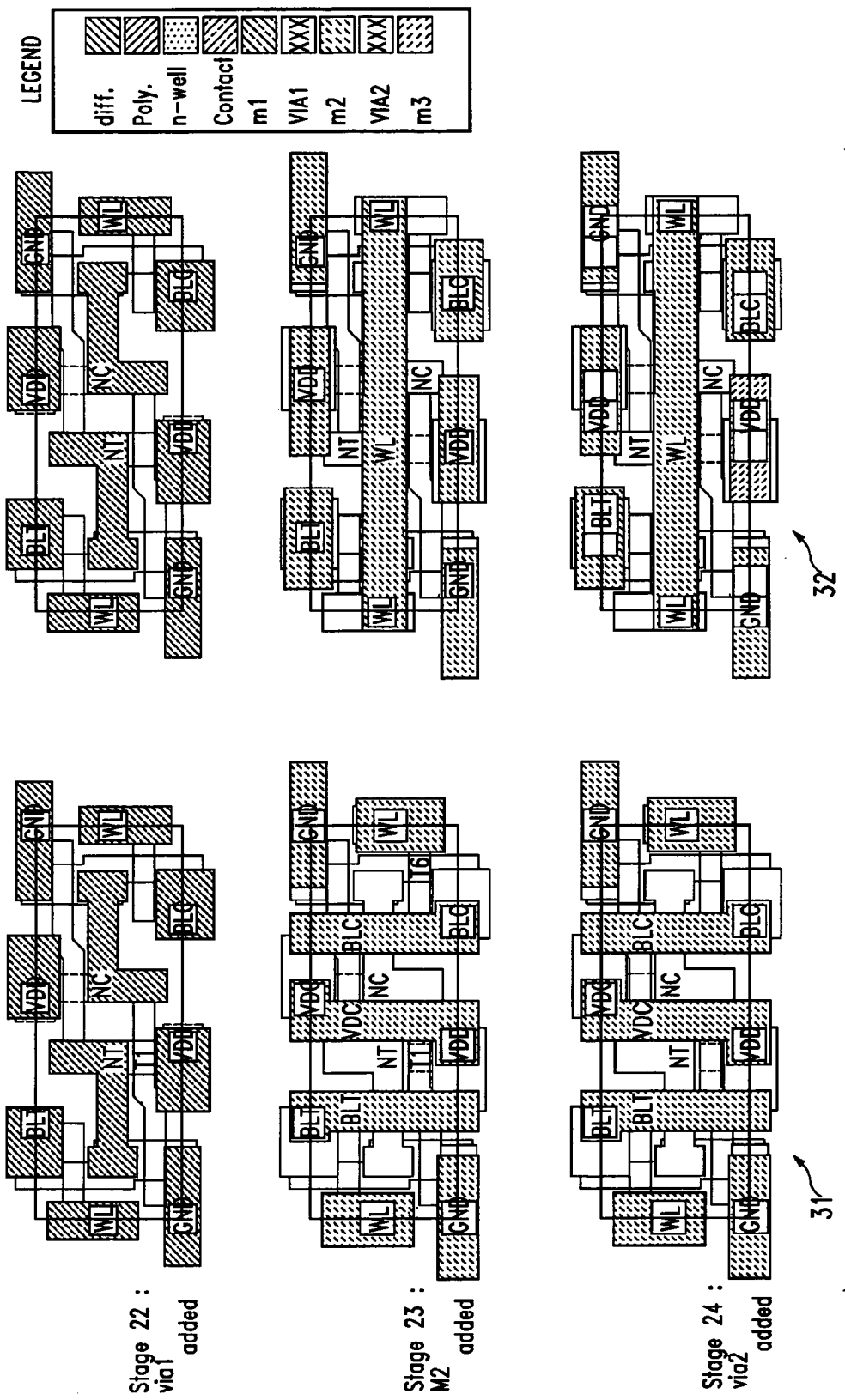
Figure 2C:
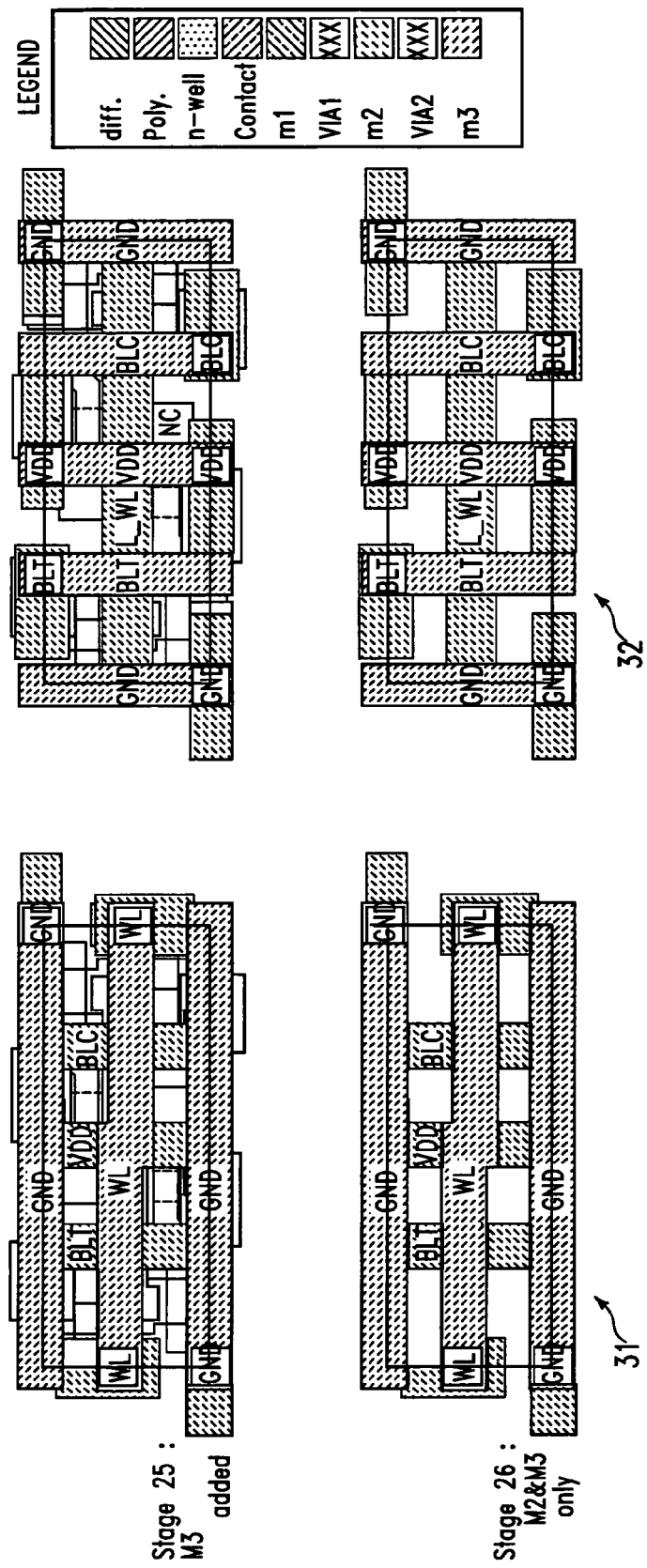

Referring now to the drawings and in particular to FIG. 1, there is depicted a method for providing SRAM cells that allow multiple variations of metal level assignments for bitlines and wordlines, in accordance with a preferred embodiment of the present invention. The starting point of the method is a metal-1 (M1) layer on which transistors are built, as shown in block 10. A determination is made as to whether a metal-2 (M2) layer or a metal-3 (M3) layer is the preferred metal layer for bitlines, as depicted in block 11.

If the preferred metal layer for bitlines is the M2 layer, then the M1-to-M2 transition layer (i.e., VIA1) is personalized with the pattern for bitlines on the M2 layer, as shown in block 12. The M2 layer is subsequently personalized with the pattern for vertical bitlines, as depicted in block 13. The M2-to-M3 transition layer (i.e., VIA2) is then personalized via the pattern for wordlines on the M3 layer, as shown in block 14. Next, the M3 layer is personalized with the pattern for the horizontal wordlines, as depicted in block 15, and the conventional processing process flow can be resumed, as shown in block 20.

Otherwise, if the preferred metal layer for bitlines is the M3 layer, then the M1-to-M2 transition layer (i.e., VIA1) is personalized with the pattern for wordlines on the M2 layer, as shown in block 16. The M2 layer is subsequently personalized with the pattern for horizontal wordlines, as depicted in block 17. The M2-to-M3 transition layer (i.e., VIA2) is then personalized with the pattern for bitlines on the M3 layer, as shown in block 18. Next, the M3 layer is personalized with the pattern for vertical bitlines, as depicted in block 19, and the conventional process flow can be resumed, as shown in block 20.

With reference now to FIG. 2, there is graphically depicted an SRAM memory cell having identical front-ends but different personalizations for back-ends, in accordance with a preferred embodiment of the present invention. As shown, an SRAM cell includes a cell element 31 and a cell element 32. Both cell elements 31 and 32 share identical processing steps up to the M1 layer, as shown in stage 21. Then, the processing steps for cell elements 31 and 32 differs according to different personalization schemes.

In stage 22, VIA1s are added to cell elements 31 and 32 at different locations. In stage 23, cell element 31 is processed at the M2 layer according to blocks 12–13 of FIG. 1, and cell element 32 is processed at the M2 layer according to blocks 16–17 of FIG. 1. In stage 24, VIA2s are added to cell elements 31 and 32 at different locations. In stage 25, cell element 31 is processed at the M3 layer according to blocks 14–15 of FIG. 1, and cell element 32 is processed at the M3 layer according to blocks 18–19 of FIG. 1. As a result, cell element 31 has bitlines on the M2 layer and wordlines on the M3 layer, and cell element 32 has wordlines on the M2 layer and bitlines on the M3 layer. Any physical shapes requiring a ground rule waiver are implemented below the M1 layer. In other words, the two different personalizations in cell elements 31 and 32 are achieved in a completely ground rule clean fashion.

As has been described, the present invention provides a method for providing an SRAM cell that enables multiple variations of metal level assignments for bitlines and wordlines. Basically, the present invention provides a method for making an SRAM cell (or memory cells in general) with two cell elements, each of the cell elements has an identical front-end level (i.e., diffusions, polysilicons and contacts) but different metal layer personalization at the back-end. As a result, each of the cell elements can have bitlines and wordlines located on different metal layers. Since most of the ground rule waivers in SRAM cells are typically related to the front-end metal layers, the two cell elements are allowed to have common front-end shapes where the most technology learning, such as lithography, model-based optical process correction, and yield learning, has to be acquired. In contrast, the differently personalized back-ends are ground rule clean and so typically little attention other than the general technology learning is required.

With the present invention, foundry customers can choose between two metalization options for the wiring of bitlines and wordlines of an SRAM cell. The two metalization options provide foundry customers with a practically "generic" SRAM cell that can be used across various SRAM architectures, regardless of the orientation of the wordlines and bitlines. Also, by maintaining the same front-end of the line mask levels (i.e., device topology), SRAM cell performance (such as beta ratio, $Q_{crit}$ and $I_{on}/I_{off}$) for both metalization schemes would remain constant.

While different SRAM cells can be used to achieve the same purpose as mentioned above, the present invention helps to share development across multiple SRAM cells and thus the total cost of memory cell development can be defrayed. The work associated with maintaining multiple SRAM cell designs along with characterization and modeling to account for new issues across the life of a product is substantial. The present invention helps to collapse the potentially multiple costs for multiple SRAM cell designs into one combined cost for a single SRAM cell platform.

Figure 3:
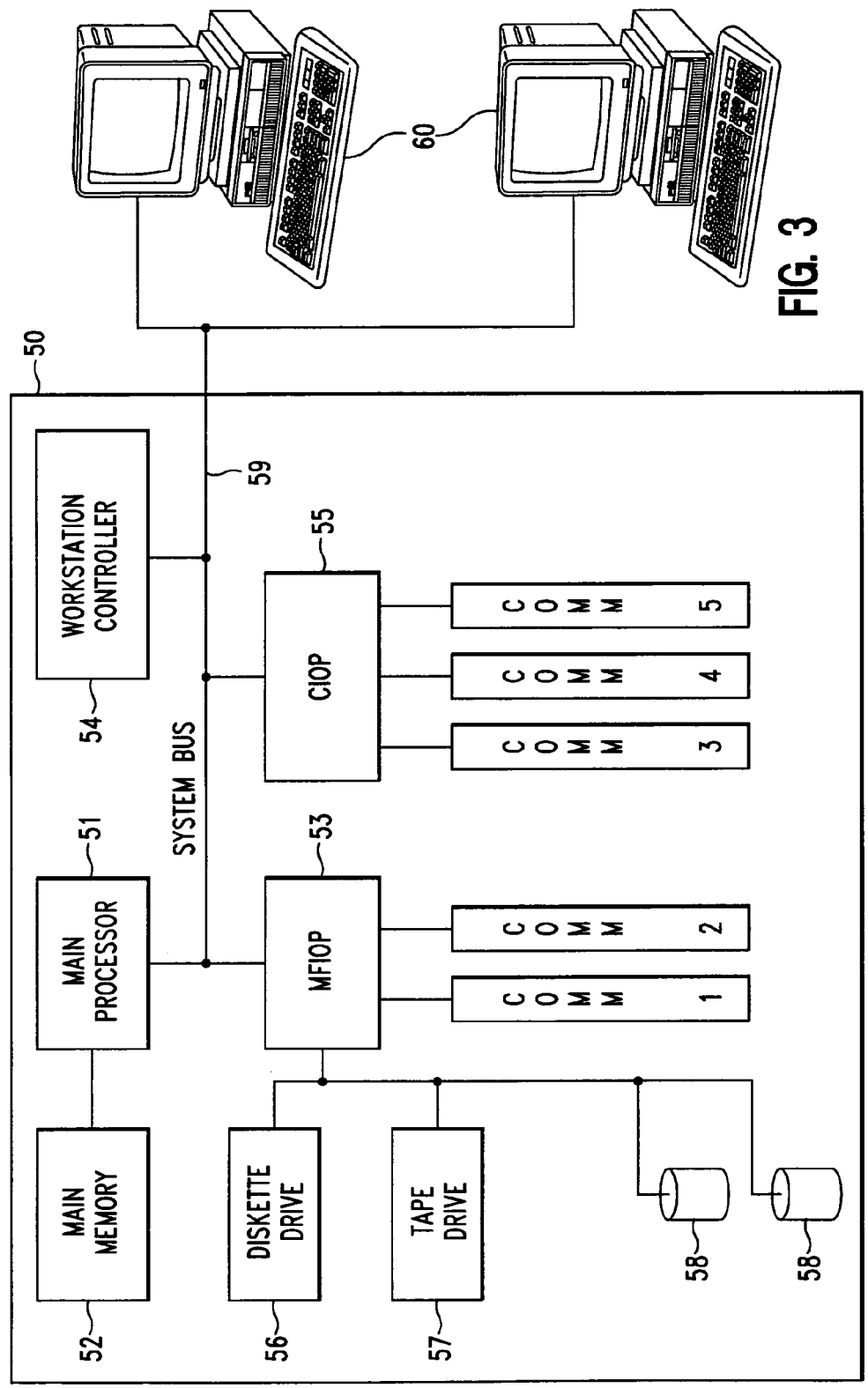
FIG. 3 is a block diagram of a computer system in which a preferred embodiment of the present invention can be implemented.

Referring now to FIG. 3, there is depicted a block diagram of a computer system in which a preferred embodiment of the present invention can be implemented. As shown, a computer system 50 includes a main processor 51 coupled to a main memory 52 and a multiple-function I/O processor (MFIOP) 53. Main processor 51 may include a single processor or multiple processors. Several peripheral storage devices, such as a diskette drive 56, a tape drive 57, and a direct access storage devices (DASDs) 58, are controlled by MFIOP 53. In addition, MFIOP 53 provides communications to other devices via communications ports such as COMM 1 and COMM 2.

A workstation controller 54 is coupled to a communications I/O processor (CIOP) 55 via a system bus 59. Workstation controller 54 provides communications between main processor 51 and workstations 60 that may be connected to computer system 50. CIOP 55 provides communications to other devices via communication ports such as COMM3, COMM4, and COMM5.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for constructing memory cells having different bitline and wordline metal layer connection options, said method comprising:

providing a memory cell with a first cell element and a second cell element;

processing a first cell element and a second cell element with identical processing steps up to a metal-1 (M1) layer;

processing said first cell element with bitlines on a metal-2 (M2) layer and wordlines on a metal-3 (M3) layer; and processing said second cell element with bitlines on said M3 layer and wordlines on said M2 layer.

2. The method of claim 1, wherein said memory cell is a static random access memory cell.

3. The method of claim 1, wherein said method further includes utilizing a layout pattern on said M1 layer for allowing said first cell element to be processed with bitlines on said M2 layer and wordlines on said M3 layer.

4. The method of claim 3, wherein said method further includes utilizing said layout pattern on said M1 layer for allowing said second cell element to be processed with bitlines on said M3 layer and wordlines on said M2 layer.

5. The method of claim 1, wherein said method further includes processing said first and second cell elements according to standard processing flow after the completion of said processing in said M2 and M3 layers.

6. A computer program product residing on a computer usable medium for constructing memory cells having different bitline and wordline metal layer connection options, said computer program product comprising:

program code means for providing a memory cell with a first cell element and a second cell element;

program code means for processing a first cell element and a second cell element with identical processing steps up to a metal-1 (M1) layer;

program code means for processing said first cell element with bitlines on a metal-2 (M2) layer and wordlines on a metal-3 (M3) layer; and program code means for processing said second cell element with bitlines on said M3 layer and wordlines on said M2 layer.

7. The computer program product of claim 6, wherein said memory cell is a static random access memory cell.

8. The computer program product of claim 6, wherein said computer program product further includes program code means for utilizing a layout pattern on said M1 layer for allowing said first cell element to be processed with bitlines on said M2 layer and wordlines on said M3 layer.

9. The computer program product of claim 8, wherein said computer program product further includes program code means for utilizing said layout pattern on said M1 layer for allowing said second cell element to be processed with bitlines on said M3 layer and wordlines on said M2 layer.

10. The computer program product of claim 6, wherein said computer program product further includes program code means for processing said first and second cell elements according to standard processing flow after the completion of said processing in said M2 and M3 layers.

11. A memory cell having different bitline and wordline metal layer connection options, said memory cell comprising:

a first cell element and a second cell element, wherein said first and second cell elements share identical processing layer designs up to a metal-1 (M1) layer; and a layout pattern on said M1 layer for allowing said first cell element to be processed with bitlines on a metal-2 (M2) layer and wordlines on a metal-3 (M3) layer, wherein said layout pattern on said M1 layer also allows said second cell element to be processed with bitlines on said M3 layer and wordlines on said M2 layer.

12. The memory cell of claim 11, wherein said memory cell is a static random access memory cell.

* * * * *